(12) United States Patent
Hargreaves

(10) Patent No.: US 9,274,643 B2
(45) Date of Patent: Mar. 1, 2016

(54) CAPACITIVE CHARGE MEASUREMENT

(75) Inventor: Kirk Hargreaves, Sunnyvale, CA (US)

(73) Assignee: Synaptics Incorporated, San Jose, CA (US)

( * ) Notice: Subject to any disclaimer, the term of this patent is extended or adjusted under 35 U.S.C. 154(b) by 896 days.

(21) Appl. No.: 13/436,688

(22) Filed: Mar. 30, 2012

(65) Prior Publication Data

US 2013/0262004 A1  Oct. 3, 2013

(51) Int. Cl.
| | |
|---|---|
| *G01R 27/26* | (2006.01) |
| *G06F 19/00* | (2011.01) |
| *G06F 3/041* | (2006.01) |
| *G06F 3/044* | (2006.01) |
| *H03K 17/96* | (2006.01) |
| *G01R 29/24* | (2006.01) |

(52) U.S. Cl.
CPC .............. *G06F 3/0416* (2013.01); *G06F 3/044* (2013.01); *H03K 17/962* (2013.01); *G01R 29/24* (2013.01); *H03K 2217/960725* (2013.01); *H03K 2217/960775* (2013.01)

(58) Field of Classification Search
CPC ................ H03K 17/962; H03K 2217/960725; H03K 2217/960775; G06F 3/044; G06F 3/0416; G06F 19/00; G01R 29/24; G01R 27/26
USPC ...................................... 706/64; 324/658–690
See application file for complete search history.

(56) References Cited

U.S. PATENT DOCUMENTS

| | | |
|---|---|---|
| 3,896,425 A | 7/1975 | Erichsen |
| 3,898,425 A | 8/1975 | Crandell et al. |
| 4,410,222 A | 10/1983 | Enomoto et al. |
| 4,459,541 A | 7/1984 | Fielden et al. |
| 5,012,124 A | 4/1991 | Hollaway |
| 5,305,017 A | 4/1994 | Gerpheide |
| 5,419,711 A | 5/1995 | Noro et al. |
| 5,451,940 A | 9/1995 | Schneider et al. |
| 5,467,023 A | 11/1995 | Takeyama |

(Continued)

FOREIGN PATENT DOCUMENTS

| | | |
|---|---|---|
| DE | 3413849 | 8/1985 |
| EP | 1521090 | 4/2005 |

(Continued)

OTHER PUBLICATIONS

Phillip, Hal "Fingering a Problem", New Electronics; Retrieved from Internet: <URL:www.newelectronics.co.uk/articles/5676/fingering-a-problem.pdf>,(Jan. 24, 2006),51-52.

(Continued)

*Primary Examiner* — John Breene
*Assistant Examiner* — Ruihua Zhang

(57) ABSTRACT

A circuit for measuring a capacitive charge comprises a latched comparator and a determination module. The latched comparator comprises an input and an output. The input is coupled with a sensor electrode of a capacitive input device. An inverted version of the output is coupled with a feedback loop. The feedback loop is configured to provide feedback to the input to maintain the input at a predetermined voltage. The feedback is provided in clocked charge quanta steps based on a clock signal. The determination module is coupled with the output and configured to determine a change in capacitance on the sensor electrode by equating output signals from the output with an amount of charge provided to the input to reach the predetermined voltage.

21 Claims, 7 Drawing Sheets

(56) References Cited

U.S. PATENT DOCUMENTS

| | | | |
|---|---|---|---|
| 5,543,591 | A | 8/1996 | Gillespie et al. |
| 5,582,523 | A | 12/1996 | Noro et al. |
| 5,627,473 | A | 5/1997 | Takani |
| 5,659,254 | A | 8/1997 | Matsumoto et al. |
| 5,730,165 | A | 3/1998 | Philipp |
| 5,973,417 | A | 10/1999 | Goetz et al. |
| 6,066,957 | A | 5/2000 | Van Loan et al. |
| 6,116,935 | A | 9/2000 | Fukuda |
| 6,257,911 | B1 | 7/2001 | Shelby et al. |
| 6,268,719 | B1 | 7/2001 | Swart |
| 6,316,951 | B1 | 11/2001 | Chiyoda |
| 6,323,846 | B1 | 11/2001 | Westerman et al. |
| 6,452,514 | B1 | 9/2002 | Philipp |
| 6,466,036 | B1 | 10/2002 | Philipp |
| 6,509,752 | B1 | 1/2003 | O'Keeffe et al. |
| 6,536,200 | B1 | 3/2003 | Schwartz |
| 6,593,755 | B1 | 7/2003 | Rosengren |
| 6,731,118 | B2 | 5/2004 | Nishino et al. |
| 6,839,052 | B1 * | 1/2005 | Kramer ............ 345/173 |
| 7,262,609 | B2 | 8/2007 | Reynolds |
| 7,288,946 | B2 * | 10/2007 | Hargreaves et al. ...... 324/678 |
| 7,301,350 | B2 | 11/2007 | Hargreaves et al. |
| 7,301,356 | B2 | 11/2007 | Machado |
| 7,417,441 | B2 | 8/2008 | Reynolds |
| 7,423,437 | B2 | 9/2008 | Hargreaves et al. |
| 7,453,270 | B2 | 11/2008 | Hargreaves et al. |
| 7,683,641 | B2 | 3/2010 | Hargreaves et al. |
| 7,777,501 | B2 | 8/2010 | Reynolds et al. |
| 7,948,245 | B2 | 5/2011 | Hargreaves et al. |
| 7,977,954 | B2 | 7/2011 | Reynolds et al. |
| 2003/0090277 | A1 | 5/2003 | Lechner et al. |
| 2004/0104826 | A1 | 6/2004 | Philipp |
| 2005/0068712 | A1 | 3/2005 | Schulz et al. |
| 2005/0099188 | A1 | 5/2005 | Baxter |
| 2006/0022682 | A1 | 2/2006 | Nakamura et al. |
| 2006/0189211 | A1 | 8/2006 | Lang et al. |
| 2008/0061800 | A1 * | 3/2008 | Reynolds et al. ......... 324/678 |
| 2008/0116904 | A1 | 5/2008 | Reynolds et al. |
| 2008/0295603 | A1 | 12/2008 | Shin et al. |
| 2009/0039902 | A1 * | 2/2009 | Hargreaves et al. ...... 324/686 |
| 2009/0152022 | A1 | 6/2009 | Jung et al. |
| 2010/0072916 | A1 | 3/2010 | Shin et al. |
| 2010/0188359 | A1 | 7/2010 | Lee |
| 2010/0188360 | A1 | 7/2010 | Joung et al. |
| 2010/0277433 | A1 | 11/2010 | Lee et al. |
| 2011/0025635 | A1 | 2/2011 | Lee |
| 2011/0037727 | A1 | 2/2011 | Lee et al. |
| 2011/0050638 | A1 | 3/2011 | Lee |
| 2011/0102353 | A1 | 5/2011 | Kim et al. |
| 2011/0199327 | A1 | 8/2011 | Shin et al. |
| 2011/0210934 | A1 | 9/2011 | Lee et al. |
| 2012/0120001 | A1 * | 5/2012 | Ningrat ............ G06F 3/0416 345/173 |

FOREIGN PATENT DOCUMENTS

| | | |
|---|---|---|
| EP | 1593988 | 11/2005 |
| FR | 2829317 | 3/2003 |
| JP | 3237594 | 10/1991 |
| WO | WO-2004/059343 | 7/2004 |
| WO | WO-2004/066498 | 8/2004 |
| WO | WO-2005/031375 | 4/2005 |

OTHER PUBLICATIONS

Cichocki, Andrzej et al., "A Switched Capacitor Interface for Capcaitive Sensors Based on Relaxation Oscillators", IEEE; vol. 39 No. 5, (Oct. 1990),797-799.

Johns, D. A., "Analog Integrated Circuit Design", *John Wiley& Sons*,(542-543),1997.

Cao, Y. et al., "High Accuracy Circuits for On-Chip Capacitance Ratio Testing or Sensor Readout", *IEEE Transactions*;vol. 41, No. 9., (Sep. 1994),637-639.

Norsworthy, S. "Effective Dithering of Sigma-Delta Modulators", *AT&T Bell Laboratories; IEEE*,(1992),1304-1307.

Seguine, D. "Capacitive Key Scan", *Cypress MicroSystems*;Version 4.1, (Oct. 2004).

"Secrets of a Successful QTouch™ Design", *Quantum Research Group; Quantum Research Application Note AN-KDO2*,Rey. 1.03, (Oct. 2005),1-11.

Kremin, Victor et al., "Capacitance Sensing—Waterproof Capacitance Sensing—AN2398", *Cypress Perform*,Document No. 001-14501 Rev.,(Dec. 8, 2006),1-11.

Seguine, D. "Capacitive Switch Scan", *Cypress MicroSystems*;Version 4.2,(Apr. 2005).

Martin, K. "A Voltage-Controlled Switch Capacitor Relaxation Oscillator", *IEEE Journ. of Solid-State Circuits*;vol. SC-16, No. 4., (Aug. 1981),412-414.

Josefsson, O. "Ask the Applications Engineer: Using Sigma-Delta Converters—Part 1", *Analog Dialogue 30th Anniversary Reader Bonus*,(1997),29-33.

Yamada, M. et al., "A Switched-Capacitor Interface for Capacitive Pressure Sensors", *IEEE*;vol. 31, No. 1., (Feb. 1992),81-86.

Toth, F. "Design Method. for Low-Cost, High-Perf. Cap. Sensors", *Delft Univ.of Tech.*;Retrieved from Internet: <URL: www.exalondelft.nl/download/CapacitiveSensors.PDF>., (1997),152.

Huang, S. M., et al., "Electronic Transducers for Industrial Measurement of Low Value Capacitances", *J. Phys. E.: Sci. Instrum. 21*,(1988),242-250.

Philipp, H. "Charge Transfer Sensing: Spread Spectrum Sensor Technology Blazes New Applications", Retrieved from Internet: <URL:www.qprox.com/background/white-paperphp>, (1997),9.

Banks, "Low Cost, Low Speed A/D Conversion for Embedded Systems", Byte Craft Limited: Retrieved from Internet, <URL: www.bytecraft.com/addaconv.html>, Feb. 2, 2007.

* cited by examiner

CAPACITIVE CHARGE MEASUREMENT

BACKGROUND

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones and tablet computers). Such touch screen input devices are typically superimposed upon or otherwise collocated with a display of the electronic device.

SUMMARY

A circuit for measuring a capacitive charge comprises a latched comparator and a determination module. The latched comparator comprises an input and an output. The input is coupled with a sensor electrode of a capacitive input device. An inverted version of the output is coupled with a feedback loop. The feedback loop is configured to provide feedback to the input to maintain the input at a predetermined voltage. The feedback is provided in clocked charge quanta steps based on a clock signal. The determination module is coupled with the output and configured to determine a change in capacitance on the sensor electrode by equating output signals from the output with an amount of charge provided to the input to reach the predetermined voltage.

BRIEF DESCRIPTION OF DRAWINGS

The drawings referred to in this Brief Description of Drawings should not be understood as being drawn to scale unless specifically noted. The accompanying drawings, which are incorporated in and form a part of the Description of Embodiments, illustrate various embodiments and, together with the Description of Embodiments, serve to explain principles discussed below, where like designations denote like elements, and.

DESCRIPTION OF EMBODIMENTS

The following Description of Embodiments is merely provided by way of example and not of limitation. Furthermore, there is no intention to be bound by any expressed or implied theory presented in the preceding technical field, background, brief summary or the following detailed description.

Various embodiments described herein provide input devices and methods that facilitate improved usability.

Figure 1:
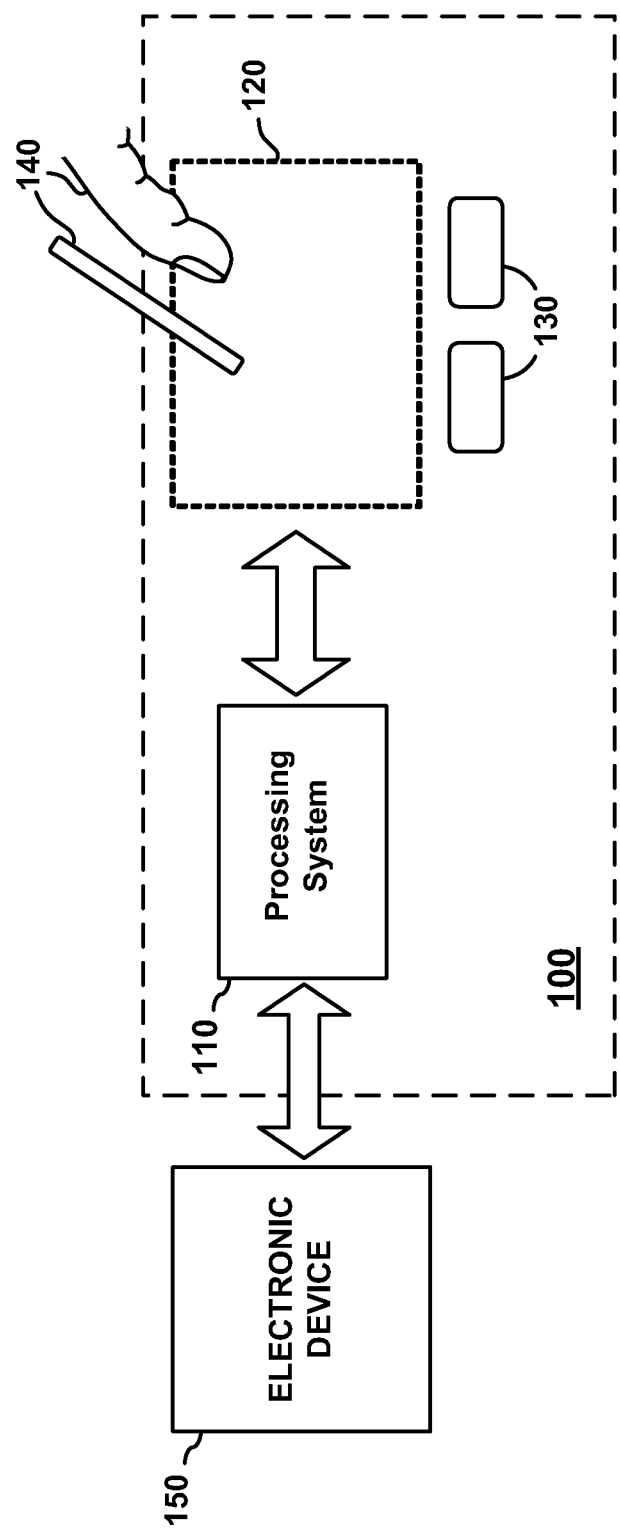
FIG. 1 is a block diagram of an example input device, in accordance with embodiments.

Turning now to the figures, FIG. 1 is a block diagram of an exemplary input device 100, in accordance with various embodiments. Input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

Input device 100 can be implemented as a physical part of the electronic system, or can be physically separate from the electronic system. As appropriate, input device 100 may communicate with parts of the electronic system using any one or more of the following: buses, networks, and other wired or wireless interconnections Examples include, but are not limited to: Inter-Integrated Circuit (I2C), Serial Peripheral Interface (SPI), Personal System 2 (PS/2), Universal Serial Bus (USB), Bluetooth®, Radio Frequency (RF), and Infrared Data Association (IrDA).

In FIG. 1, input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near input device 100 in which input device 100 is able to detect user input (e.g., user input provided by one or more input objects 140). The sizes, shapes, and locations of particular sensing regions may vary widely from embodiment to embodiment. In some embodiments, sensing region 120 extends from a surface of input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of input device 100, contact with an input surface (e.g., a touch surface) of input device 100, contact with an input surface of input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, sensing region 120 has a rectangular shape when projected onto an input surface of input device 100.

Input device 100 may utilize any combination of sensor components and sensing technologies to detect user input in sensing region 120. Input device 100 comprises one or more sensing elements for detecting user input. As a non-limiting example, input device 100 may use capacitive techniques.

Some implementations are configured to provide images that span one, two, three, or higher dimensional spaces. Some implementations are configured to provide projections of input along particular axes or planes.

In some capacitive implementations of input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Collectively transmitters and receivers may be referred to as sensor electrodes or sensor elements. Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g., other electromagnetic signals). Sensor electrodes may be dedicated transmitters or receivers, or may be configured to both transmit and receive. In some embodiments, one or more receiver electrodes may be operated to receive a resulting signal when no transmitter electrodes are transmitting (e.g., the transmitters are disabled). In this manner, the resulting signal represents noise detected in the operating environment of sensing region 120.

In FIG. 1, a processing system 110 is shown as part of input device 100. Processing system 110 is configured to operate the hardware of input device 100 to detect input in sensing region 120. Processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, processing system 110 also comprises electronically-readable instructions, such as firmware code, software code, and/or the like. In some embodiments, components composing processing system 110 are located together, such as near sensing element(s) of input device 100. In other embodiments, components of processing system 110 are physically separate with one or more components close to sensing element(s) of input device 100, and one or more components elsewhere. For example, input device 100 may be a peripheral coupled to a desktop computer, and processing system 110 may comprise software configured to run on a central processing unit of the desktop computer and one or more ICs (perhaps with associated firmware) separate from the central processing unit. As another example, input device 100 may be physically integrated in a phone, and processing system 110 may comprise circuits and firmware that are part of a main processor of the phone. In some embodiments, processing system 110 is dedicated to implementing input device 100. In other embodiments, processing system 110 also performs other functions, such as operating display screens, driving haptic actuators, etc.

Processing system 110 may be implemented as a set of modules that handle different functions of processing system 110. Each module may comprise circuitry that is a part of processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, processing system 110 responds to user input (or lack of user input) in sensing region 120 directly by causing one or more actions. Example actions include changing operation modes, as well as GUI actions such as cursor movement, selection, menu navigation, and other functions. In some embodiments, processing system 110 provides information about the input (or lack of input) to some part of the electronic system (e.g. to a central processing system of the electronic system that is separate from processing system 110, if such a separate central processing system exists). In some embodiments, some part of the electronic system processes information received from processing system 110 to act on user input, such as to facilitate a full range of actions, including mode changing actions and GUI actions.

For example, in some embodiments, processing system 110 operates the sensing element(s) of input device 100 to produce electrical signals indicative of input (or lack of input) in sensing region 120. Processing system 110 may perform any appropriate amount of processing on the electrical signals in producing the information provided to the electronic system. For example, processing system 110 may digitize analog electrical signals obtained from the sensor electrodes. As another example, processing system 110 may perform filtering or other signal conditioning. As yet another example, processing system 110 may subtract or otherwise account for a baseline, such that the information reflects a difference between the electrical signals and the baseline. As yet further examples, processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, input device 100 is implemented with additional input components that are operated by processing system 110 or by some other processing system. These additional input components may provide redundant functionality for input in sensing region 120, or some other functionality. FIG. 1 shows buttons 130 near sensing region 120 that can be used to facilitate selection of items using input device 100. Other types of additional input components include sliders, balls, wheels, switches, and the like. Conversely, in some embodiments, input device 100 may be implemented with no other input components.

In some embodiments, input device 100 may be a touch screen, and sensing region 120 overlaps at least part of an active area of a display screen. For example, input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. Input device 100 and the display screen may share physical elements. For example, some embodiments may utilize some of the same electrical components for displaying and sensing. As another example, the display screen may be operated in part or in total by processing system 110.

It should be understood that while many embodiments are described in the context of a fully functioning apparatus, the mechanisms are capable of being distributed as a program product (e.g., software) in a variety of forms. For example, the mechanisms that are described may be implemented and distributed as a software program on information bearing media that are readable by electronic processors (e.g., non-transitory computer-readable and/or recordable/writable information bearing media readable by processing system 110). Additionally, the embodiments apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other tangible storage technology.

Figure 2:
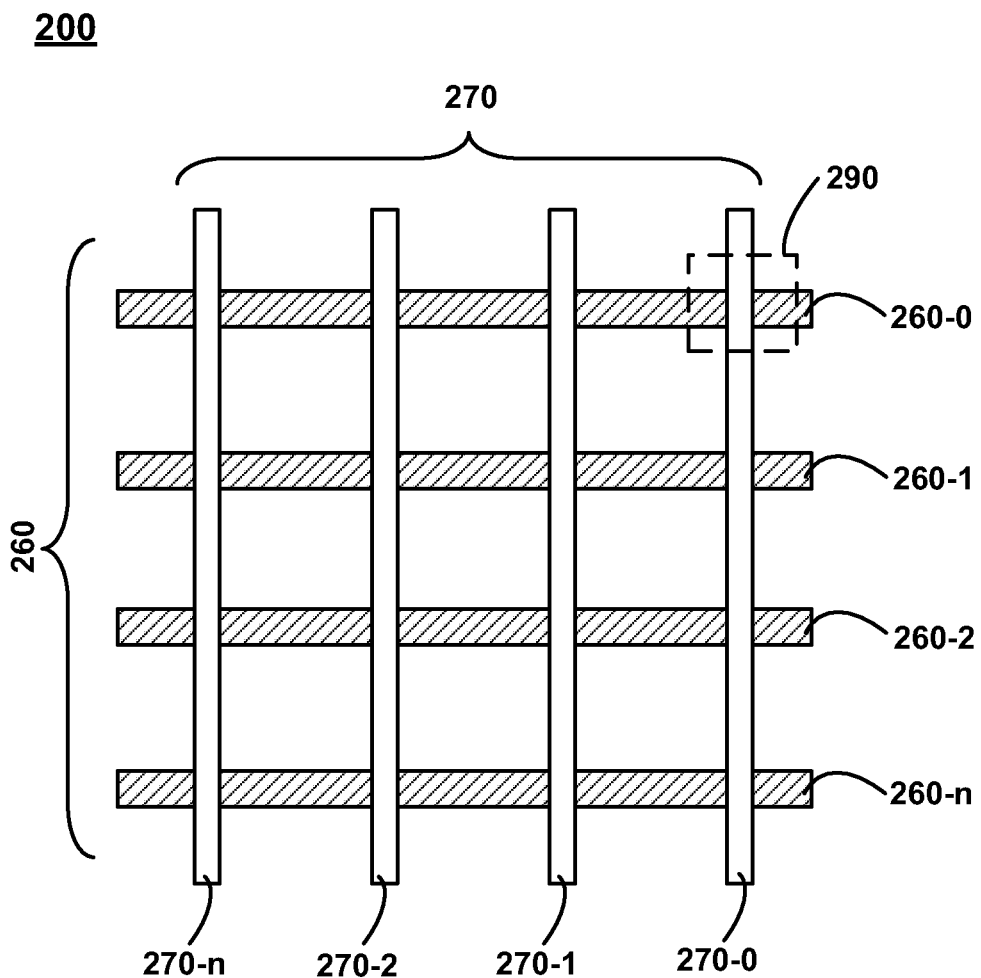
FIG. 2 shows a portion of an example sensor electrode pattern which may be utilized in a sensor to generate all or part of the sensing region of an input device, such as a touch screen, according to some embodiments.

FIG. 2 shows a portion of an example sensor electrode pattern 200 which may be utilized in a sensor to generate all or part of the sensing region of a input device 100, according to various embodiments. Input device 100 is configured as a capacitive input device when utilized with a capacitive sensor electrode pattern. For purposes of clarity of illustration and description, a non-limiting simple rectangular sensor electrode pattern 200 is illustrated. It is appreciated that numerous other sensor electrode patterns may be employed. The illustrated sensor electrode pattern is made up of a plurality of receiver electrodes 270 (270-0, 270-1, 270-2 . . . 270-n) and a plurality of transmitter electrodes 260 (260-0, 260-1, 260-2 . . . 260-n) which overlay one another, in this example. In the illustrated example, touch sensing pixels are centered at locations where transmitter and receiver electrodes cross. Capacitive pixel 290 illustrates one of the capacitive pixels generated by sensor electrode pattern 200. It is appreciated that in a crossing sensor electrode pattern, such as the illustrated example, some form of insulating material or substrate is typically disposed between transmitter electrodes 260 and receiver electrodes 270. However, in some embodiments, transmitter electrodes 260 and receiver electrodes 270 may be disposed on the same layer as one another through use of routing techniques and/or jumpers. Further, in various embodiments, transmitter electrodes 260 and receiver electrodes 270 may have various different shapes and sizes. In various embodiments, touch sensing includes sensing input objects anywhere in sensing region 120 and may comprise: no contact with any surfaces of the input device 100, contact with an input surface (e.g., a touch surface) of the input device 100, contact with an input surface of the input device 100 coupled with some amount of applied force or pressure, and/or a combination thereof.

Capacitive pixels, such as capacitive pixel 290, are areas of localized capacitive coupling between transmitter electrodes 260 and receiver electrodes 270. The capacitive coupling between transmitter electrodes 260 and receiver electrodes 270 changes with the proximity and motion of input objects in the sensing region associated with transmitter electrodes 260 and receiver electrodes 270.

In some embodiments, sensor electrode pattern 200 is "scanned" to determine these capacitive couplings. That is, the transmitter electrodes 260 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 270 to be independently determined.

The receiver electrodes 270 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

Example Capacitive Charge Measuring Circuits

Figure 3:
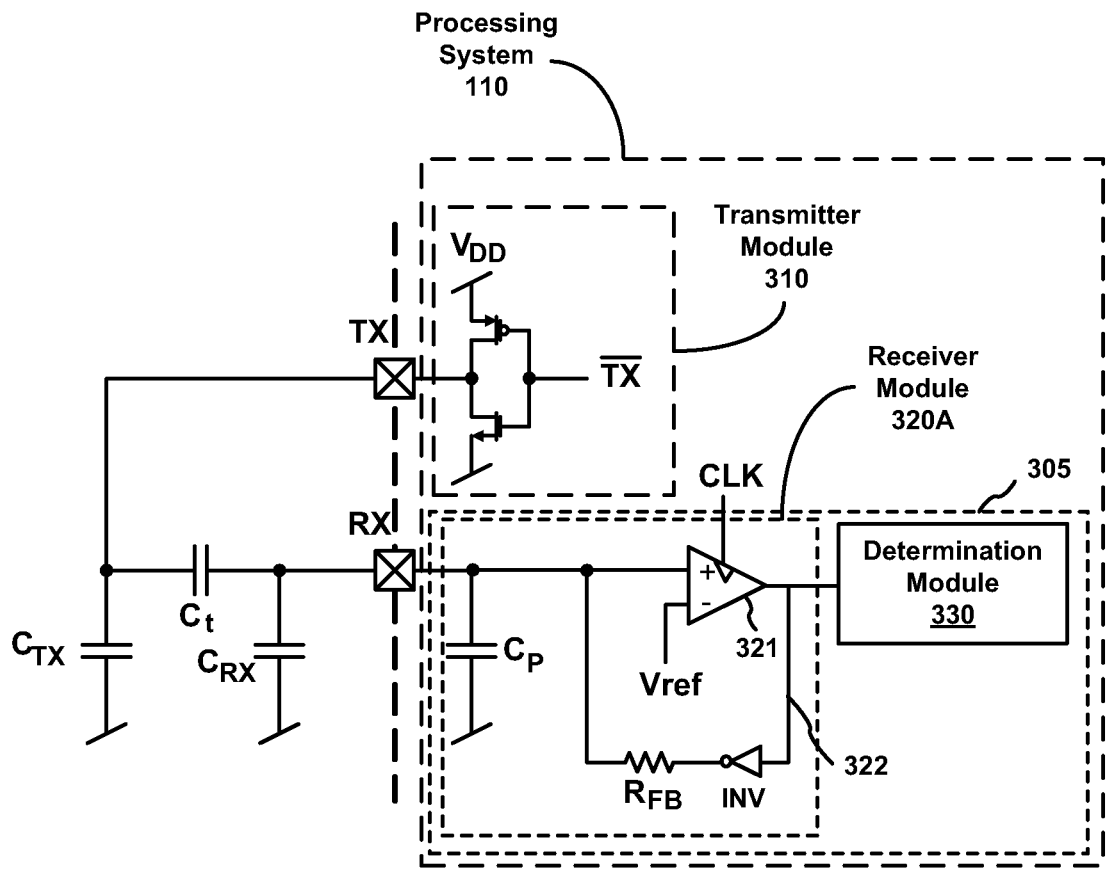
FIG. 3 shows a processing system with a capacitive charge measuring circuit, according to some embodiments.

FIG. 3 shows processing system 110 with a capacitive charge measuring circuit 305, according to some embodiments. As illustrated in FIG. 3, processing system 110 includes a transmitter module 310, a receiver module 320A, and a determination module 330. Receiver module 320A and determination module 330 are included in capacitive charge measuring circuit 305, in some embodiments.

Transmitter module 310 operates to couple a transmitter signal with a transmitter sensor electrode, TX, of a sensor electrode pattern such as sensor electrode pattern 200 employed by a capacitive input device such as input device 100. In one embodiment, the transmitter signal comprises driving the transmitter electrode from a first voltage potential to a second voltage potential. In one embodiment, the transmitter electrode is driven with VDD and then driven with system ground. The transmitter signal charges a capacitance $C_{TX}$ on transmitter sensor electrode TX. The transmitter signal is driven by a transmitter input (shown as TXbar) provided by processing system 110. As illustrated in FIG. 3, when TXbar is high a first transistor is closed, and transmitter electrode TX is coupled with system ground; when TXbar is low a second transistor is closed and transmitter electrode TX is coupled with VDD. Transmitter sensor electrode TX induces a charge, through a resulting signal coupled through the capacitance under test $C_T$, onto receiver sensor electrode RX. The induced charge is stored on the parasitic receiver sensor electrode capacitances $C_{RX}$ and $C_P$.

Receiver module 320A inputs a sample of a resulting signal by measuring charge $C_{RX}$ from receiver sensor electrode RX in response to a clock signal (CLK). The sampled signal is received at a latched input of a latched comparator 321, which is coupled with receiver sensor electrode RX. The inverting input of latched comparator 321 is coupled with Vref. Herein, latched comparator 321 is illustrated as a generic latched comparator, but it is appreciated that other types of latched comparators, such as, for example, a D flip-flop or a T flip-flop may be utilized with minimal modification. Use of a D flip-flop is illustrated in FIGS. 4-7. In feedback loop 322, invertor INV is used to invert the output of the latched comparator for purposes of feedback, this causes the output provided to determination module 330 to be a complement of the signal used in feedback to the latched input.

Feedback loop 322 provides feedback to the input of latched comparator 321 to maintain the input at a predetermined voltage. In some embodiments, the predetermined voltage is an input threshold voltage of latched comparator 321. Latched comparator 321 is clocked at a high frequency (such as 100 MHz), and the feedback is provided in clocked charge quanta steps based on the clock signal CLK received at latched comparator 321. When the input of latched comparator 321 is below the predetermined voltage, the output will be low and the inverted feedback will be high, causing feedback loop 322 to add a clocked quanta of charge to receiver sensor electrode RX and the input of latched comparator 321. When the input of latched, comparator 321 is above the predetermined voltage, the output will be low, causing feedback loop 322 to subtract a clocked quanta of charge from receiver sensor electrode RX and the input of latched comparator 321.

Determination module 330 effectively measures the current, in clocked charge quanta steps, that is provided in feedback to the input of latched comparator 321 in order to arrive at the predetermined voltage level. This measurement of the amount of current provided in clocked charge quanta steps allows for a measurement of the change in capacitive charge induced through $C_T$ onto receiver electrode RX. This is measured by coupling the output of latched, comparator 321 with determination module 330 and, then utilizing logic to process the signal from this output, where processing may include integration, demodulation, and filtering of the signal received from the output. In this manner determination module 330 operates to determine a change in capacitance induced on receiver sensor electrode RX by equating output signals from the output with an amount of charge provided to the input of latched comparator 321 in order to reach the predetermined voltage.

In the feedback loop 322 illustrated in receiver module 320A, an inverter INV and a single resistor $R_{FB}$ are disposed in series between the output and the input of latched comparator 321. Inverter INV provides an inverted version of the output of latched comparator 321. $R_{FB}$, in some embodiments, is the only analog component utilized in charge measuring circuit 305. $R_{FB}$ provides symmetric feedback whether the inverted version of the output is high or low. In other embodiments, two feedback resistors of differing size may be employed, along with logic, such that a first feedback resistor is utilized in feedback loop 322 when the inverted version of the output is high and a second feedback resistor is placed in feedback loop 322 when the inverted version of the output is low. In such an embodiment, the feedback provided to the input of latched comparator 321 is non-symmetric. In one embodiment, feedback loop 322 may comprise a capacitor.

Figure 4:
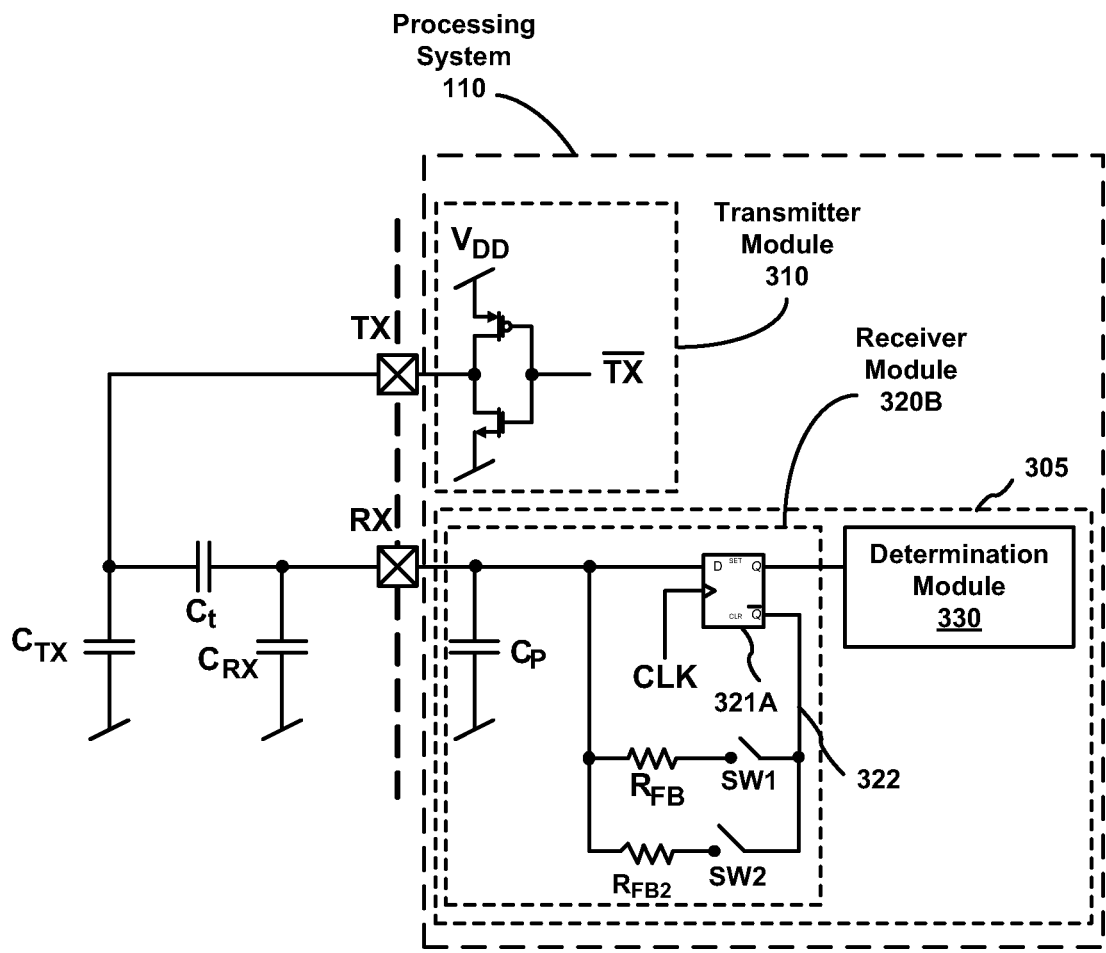
FIG. 4 shows a processing system with a capacitive charge measuring circuit, according to some embodiments.

FIG. 4 shows processing system 110 with a capacitive charge measuring circuit 305, according to some embodiments. FIG. 4 illustrates a variation on circuit 305 as compared with FIG. 3. In FIG. 4, receiver module 320B includes a second feedback resistor $R_{FB2}$ in parallel with $R_{FB}$, and generic latched comparator 321 and inverter INV have been replaced with D flip-flop 321A which includes an output (Q) and an inverted output (Qbar) which are complements of one another. The latched input, which may be referred to herein as simply an input, is depicted as input D of latched comparator 321A. A first output (non-inverted output Q in the illustrated example) of latched comparator 321A is coupled with determination module 330. A second output (inverted output Qbar in the illustrated example) of latched comparator 321A is coupled with feedback loop 322. The first and second outputs (e.g., Q and Qbar as illustrated) are complements of one another, thus obviating the separate invertor INV depicted in feedback loop 322 in FIG. 3. Switch SW1 can be selectively closed by processing system 110 to utilize $R_{FB}$ in feedback loop 322. Similarly, Switch SW2 can be selectively closed by processing system 110 to utilize $R_{FB2}$ in feedback loop 322. In some embodiments, $R_{FB2}$ is smaller in size (e.g., one half or one tenth the value of RFB) so that it can be selected to provide larger quanta of charge at the beginning of a measurement process (first stage of feedback). $R_{FB}$ can then be selected to perform finer measurements (second stage of feedback). Providing two stages of feedback allows capacitance measurements to be made more quickly but still with fine resolution. In some embodiments two stage feedback can be implemented using a single feedback resistor with a bypass switch in parallel and no additional feedback resistor. It is further appreciated that, in some embodiments, more than two selectable feedback resistors may be employed to provide more than two stages of feedback. As the first and second outputs (Q and Qbar) of latched comparator 321A are compliments of one another, they can be switched in some embodiments such that the first output is coupled with feedback loop 322 and the second output is coupled with determination module 330.

Figure 5:
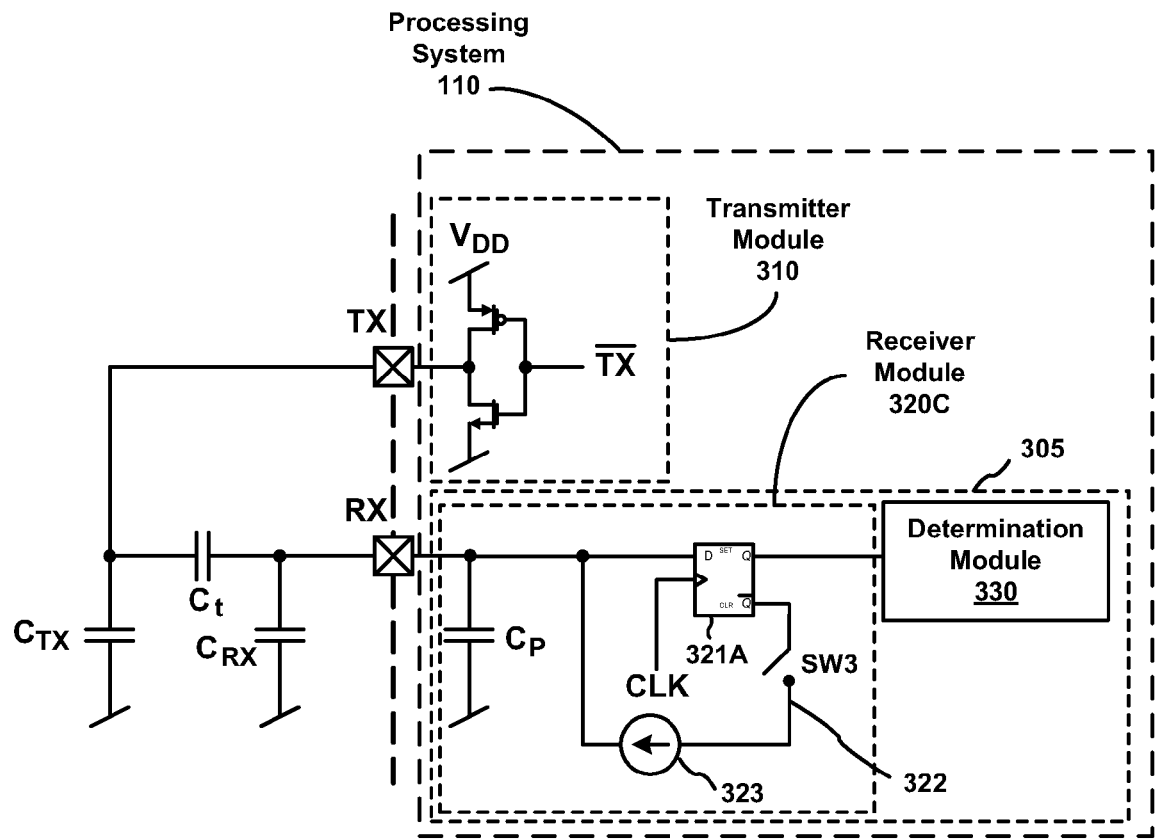
FIG. 5 shows a processing system with a capacitive charge measuring circuit, according to some embodiments.

FIG. 5 shows processing system 110 with a capacitive charge measuring circuit 305, according to some embodiments. FIG. 5 illustrates a variation on circuit 305 as compared with FIG. 3. In FIG. 5, receiver module 320C includes a current source 323 instead of feedback resistor $R_{FB}$ of receiver module 320A, and again generic latched comparator 321 and inverter INV have been replaced with D flip-flop 321A which includes an output (Q) and an inverted output (Qbar) which are complements of one another. By closing switch SW3, processing system 110 can selectively couple current source 323 in series into feedback loop 322. It should be appreciated that multiple current sources can be employed to provide a multi-stage feedback as described in conjunction with FIG. 4 or to provide non-symmetric feedback.

Figure 6:
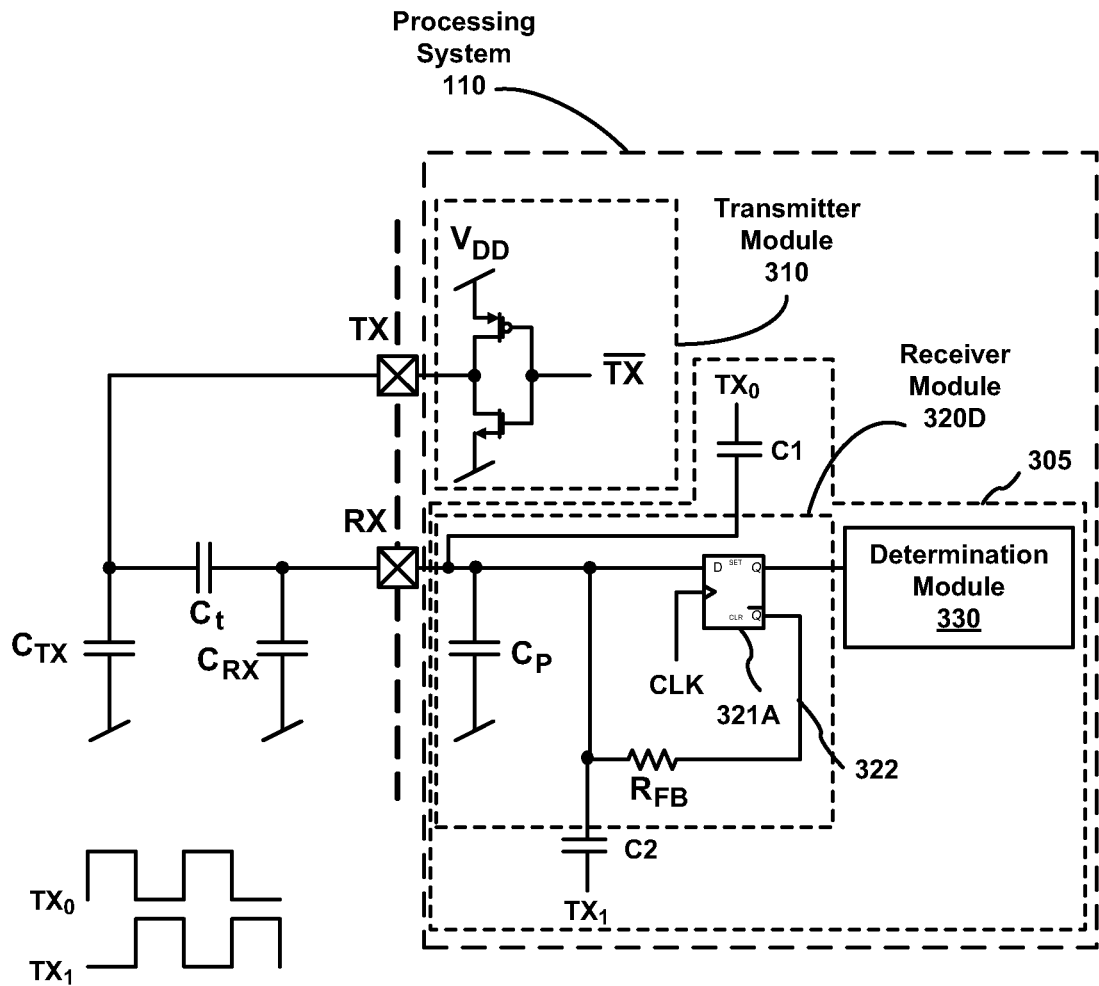
FIG. 6 shows a processing system with a capacitive charge measuring circuit, according to some embodiments.

FIG. 6 shows processing system 110 with a capacitive charge measuring circuit 305, according to some embodiments. FIG. 6 illustrates a variation on circuit 305 as compared with FIG. 3. In FIG. 6, generic latched comparator 321 and inverter INV have again been replaced with D flip-flop 321A which includes an output (Q) and an inverted output (Qbar) which are complements of one another; and offset capacitors C1 and C2 are included in receiver module 320D and are coupled with the input of latched comparator 321A, and. Various signals such as signals TX1 and TX2 may be provided to charge offset capacitors C1 and C2 and offset the capacitance at the input of latched comparator 321A. Although two offset capacitors are depicted a greater or lesser number may be utilized. For example, in some embodiments, a selectable bank of two or more capacitors may be utilized in a similar manner instead of just the two separately illustrated capacitors C1 and C2.

Figure 7:
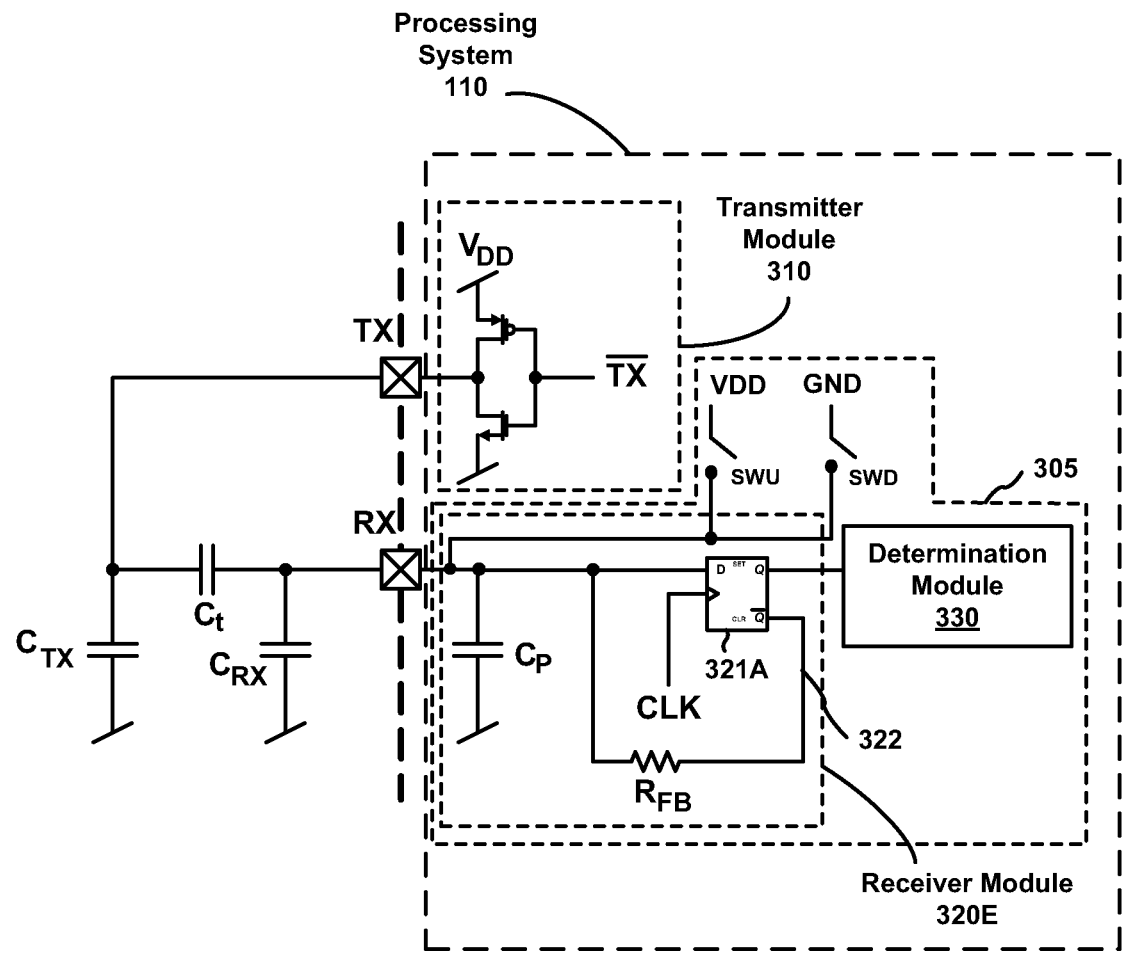
FIG. 7 shows a processing system with a capacitive charge measuring circuit, according to some embodiments.

FIG. 7 shows processing system 110 with a capacitive charge measuring circuit 305, according to some embodiments. FIG. 7 illustrates a variation on circuit 305 as compared with FIG. 3. In FIG. 7, receiver sensor electrode RX is coupled with a pull-up to VDD and a pull-down to system ground, and again generic latched comparator 321 and inverter INV have been replaced with D flip-flop 321A which includes an output (Q) and an inverted output (Qbar) which are complements of one another. The pull-up and pull-down may be implemented with selectable switches SWU and SWD, respectively, as illustrated. Further, the pull-up and pull-down may be implemented interior to receiver module 320E, as illustrated, or exterior to receiver module 320E. In one embodiment, the pull-up and pull-down may be selectively employed by processing system 110, when transmitter module 310 is turned off, such that receiver sensor electrode RX can be utilized for absolute capacitive sensing. For example, by closing switch SWU, VDD may be applied to receiver sensor electrode RX to charge it, and then capacitance measurement circuit 305 may then be employed to measure any change in capacitance that occurs as the result of an input object capacitive interacting with receiver sensor electrode RX. The absolute capacitance of the receiver electrode may be measured using the same techniques as described above in relation to measuring the transcapacitance. Further, switch SWD may be selectively closed in a similar manner to ground receiver sensor electrode RX.

It should be appreciated that the embodiments illustrated in FIGS. 3 through 7 may be utilized in various combinations with one another, and that they have only been depicted and described in isolation for purposes of clarity.

Thus, the examples set forth herein were presented in order to best explain, to describe particular applications, and to thereby enable those skilled in the art to make and use embodiments of the described examples. However, those skilled in the art will recognize that the foregoing description and examples have been presented for the purposes of illustration and example only. The description as set forth is not intended to be exhaustive or to limit the embodiments to the precise form disclosed.

What is claimed is:

1. A circuit for measuring a capacitive charge, said circuit comprising:
   a latched comparator, wherein said latched comparator comprises:
      an input coupled with a sensor electrode of a capacitive input device;
      an output; and
      an inverted version of the output coupled with a feedback loop, said feedback loop configured to provide feedback to said input to maintain said input at a predetermined voltage, wherein said feedback is provided in clocked charge quanta steps based on a clock signal; and
   a determination module coupled with said output and configured to determine a change in capacitance on said sensor electrode by equating output signals from said output with an amount of charge provided to said input to reach said predetermined voltage.

2. The circuit of claim 1, further comprising:
   a parasitic capacitance coupled with said input for storing a capacitive charge based on a resulting signal received on said sensor electrode.

3. The circuit of claim 1, further comprising:
   an offset capacitance coupled with said input.

4. The circuit of claim 1, further comprising:
   a pull-up network coupled with said sensor electrode; and
   a pull-down network coupled with said sensor electrode, wherein said circuit is configured to measure a change in absolute capacitance on said sensor electrode.

5. The circuit of claim 1, wherein said latched comparator comprises a flip-flop.

6. The circuit of claim 1, wherein said feedback loop comprises a first resistor coupled in series.

7. The circuit of claim 1, wherein said feedback loop comprises a current source coupled in series and configured to provide said clocked charge quanta.

8. The circuit of claim 1, wherein said inverted version of said output configured to provide feedback to said input comprises:
   said inverted version of said output configured to trigger addition of a clocked charge quanta when a voltage at said input is below said predetermined voltage; and
   said inverted version of said output configured to trigger subtraction of a clocked charge quanta when said voltage at said input is above said predetermined voltage.

9. The circuit of claim 1, wherein said predetermined voltage comprises an input threshold voltage of said latched comparator.

10. A processing system for a capacitive input device, said processing system comprising:
    a receiver module comprising:
       an input configured to be maintained at a predetermined voltage, wherein said input is coupled with a receiver electrode of said capacitive input device;
       an output; and
       an inverted version of said output coupled to said input; and
    a determination module coupled with said output and configured to determine a change in capacitance on said receiver electrode by equating output signals from said output with an amount of charge provided in feedback to said input to reach said predetermined voltage.

11. The processing system of claim 10, further comprising:
    a parasitic capacitance coupled with said input and configured for storing a capacitive charge based on a resulting signal received on said receiver electrode.

12. The processing system of claim 10, further comprising:
an offset capacitance coupled with said input.

13. The processing system of claim 10, further comprising:
a pull-up network coupled with said receiver electrode; and
a pull-down network coupled with said receiver electrode, wherein said processing system is configured to measure a change in absolute capacitance on said receiver electrode.

14. The processing system of claim 10, further comprising a feedback loop coupled to said input and configured to provide feedback to said input to maintain said input at said predetermined voltage, wherein said feedback is provided in clocked charge quanta steps based on a clock signal.

15. The processing system of claim 14, wherein said feedback loop is configured to:
add a clocked charge quanta when a voltage at said input is below said predetermined voltage; and
subtract a clocked charge quanta when said voltage at said input is above said predetermined voltage.

16. The processing system of claim 10, wherein said input is an input of a latched comparator.

17. The processing system of claim 16, wherein said predetermined voltage comprises an input threshold voltage of said latched comparator.

18. A capacitive input device comprising:
a plurality of sensor electrodes; and
a processing system coupled with said plurality of sensor electrodes, said processing system comprising:
a transmitter module configured to drive a transmitter electrode of said plurality of sensor electrodes with a transmitter signal;
a receiver module comprising:
an input configured to be maintained at a predetermined voltage, wherein said input is coupled with a receiver electrode of said plurality of sensor electrodes;
an output; and
an inverted version of said output coupled to said input; and
a determination module coupled with said output and configured to determine a change in capacitance on said receiver electrode by equating output signals from said output with an amount of charge provided in feedback to said input to reach said predetermined voltage.

19. The capacitive input device of claim 18, further comprising:
a parasitic capacitance coupled with said input and configured for storing a capacitive charge based on a resulting signal received on said receiver electrode, said resulting signal comprising effects corresponding to the transmitter signal.

20. The capacitive input device of claim 18, further comprising:
a feedback loop coupled to said input and configured to provide feedback to said input to maintain said input at said predetermined voltage, wherein said feedback is provided in clocked charge quanta steps based on a clock signal, wherein said feedback loop is configured to:
add a clocked charge quanta when a voltage at said input is below said predetermined voltage; and
subtract a clocked charge quanta when said voltage at said input is above said predetermined voltage.

21. The capacitive input device of claim 18, wherein said input is an input of a latched comparator.

* * * * *